(12) United States Patent
Latypov et al.

(10) Patent No.: US 7,773,287 B2
(45) Date of Patent: Aug. 10, 2010

(54) METHOD AND SYSTEM FOR MASKLESS LITHOGRAPHY REAL-TIME PATTERN RASTERIZATION AND USING COMPUTATIONALLY COUPLED MIRRORS TO ACHIEVE OPTIMUM FEATURE REPRESENTATION

(75) Inventors: Azat M. Latypov, Danbury, CT (US); Kars Zegar Troost, Waalre (NL); Johannes Jacobus Matheus Baselmans, Oirschot (NL)

(73) Assignee: ASML Holding N.V., Veldhoven (NL)

( * ) Notice: Subject to any disclaimer, the term of this patent is extended or adjusted under 35 U.S.C. 154(b) by 14 days.

(21) Appl. No.: 11/790,222

(22) Filed: Apr. 24, 2007

(65) Prior Publication Data

US 2007/0268547 A1 Nov. 22, 2007

Related U.S. Application Data

(62) Division of application No. 11/170,065, filed on Jun. 30, 2005, now Pat. No. 7,209,275.

(51) Int. Cl.
*G02B 26/00* (2006.01)

(52) U.S. Cl. ...................................... 359/292

(58) Field of Classification Search ................ 359/292, 359/237, 223, 318, 281, 285, 578, 855; 355/53, 355/67, 71, 77
See application file for complete search history.

(56) References Cited

U.S. PATENT DOCUMENTS 6,312,134 B1 * 11/2001 Jain et al. .................... 359/855

(Continued)

FOREIGN PATENT DOCUMENTS

JP 2003-345030 A 12/2003

(Continued)

OTHER PUBLICATIONS

Notification of Reasons for Refusal for Japanese Application No. 2006-177843 mailed May 7, 2009, 6 pgs.

(Continued)

*Primary Examiner*—Timothy J Thompson
*Assistant Examiner*—Tuyen Q Tra
(74) *Attorney, Agent, or Firm*—Sterne, Kessler, Goldstein & Fox P.L.L.C

(57) ABSTRACT

A method and system for determining specific pixel modulation states of a spatial light modulator (SLM) to print a desired pattern on a substrate are disclosed. The method includes selecting at least one super-pixel in an object plane of the desired pattern, the super-pixel being formed of at least two pixels. At least one edge of the desired pattern crosses a boundary within the super-pixel, the at least one edge being defined by specific slope and position parameters relative to the super-pixel. The method also includes (i) forming an interpolation table to tabulate pre-calculated pixel modulation states and (ii) determining the specific pixel modulation states for each of the pixels in accordance with the interpolation table. Disclosed also are a method and system for providing a spatial light modulator (SLM). The SLM includes a plurality of mirrors structured to form groups of super-pixels. Each super-pixel (i) includes two or more mirrors from the plurality of mirrors and (ii) is configured to switch only one pixel of light. Each of the two or more mirrors can be separately actuated.

15 Claims, 11 Drawing Sheets

U.S. PATENT DOCUMENTS

| | | |
|---|---|---|
| 6,504,644 B1 | 1/2003 | Sandstrom |
| 6,618,185 B2 | 9/2003 | Sandstrom |
| 6,831,768 B1 * | 12/2004 | Cebuhar et al. ............. 359/291 |
| 6,963,434 B1 * | 11/2005 | Latypov ..................... 359/237 |
| 6,965,436 B2 * | 11/2005 | Latypov et al. ............. 356/520 |
| 7,126,672 B2 | 10/2006 | Tinnemans et al. |
| 7,190,434 B2 | 3/2007 | Gui et al. |
| 7,209,275 B2 | 4/2007 | Latypov et al. |
| 7,239,373 B2 | 7/2007 | Tinnemans et al. |
| 7,302,111 B2 | 11/2007 | Olsson et al. |
| 7,317,510 B2 | 1/2008 | Bantekoe et al. |
| 7,330,239 B2 | 2/2008 | Baselmans et al. |
| 7,400,382 B2 | 7/2008 | Baba-Ali et al. |
| 7,411,652 B2 | 8/2008 | Bleeker et al. |
| 2003/0160980 A1 | 8/2003 | Olsson et al. |
| 2005/0068510 A1 | 3/2005 | Bleeker et al. |
| 2005/0153246 A1 | 7/2005 | Eib et al. |
| 2006/0033902 A1 * | 2/2006 | Latypov et al. ............... 355/67 |
| 2007/0206172 A1 | 9/2007 | Gui et al. |
| 2008/0024745 A1 | 1/2008 | Baselmans et al. |

FOREIGN PATENT DOCUMENTS

| | | |
|---|---|---|
| JP | 2004-006440 A | 1/2004 |
| JP | 2004-062157 A | 2/2004 |
| JP | 2004-157219 A | 6/2004 |
| JP | 2005-502909 A | 1/2005 |
| JP | 2005-136387 A | 5/2005 |
| WO | WO 2003/023488 A1 | 3/2003 |

OTHER PUBLICATIONS

Search Report and Written Opinion mailed Jan. 12, 2006 for European Application No. 06253270.0-1226, 9 pgs.

* cited by examiner

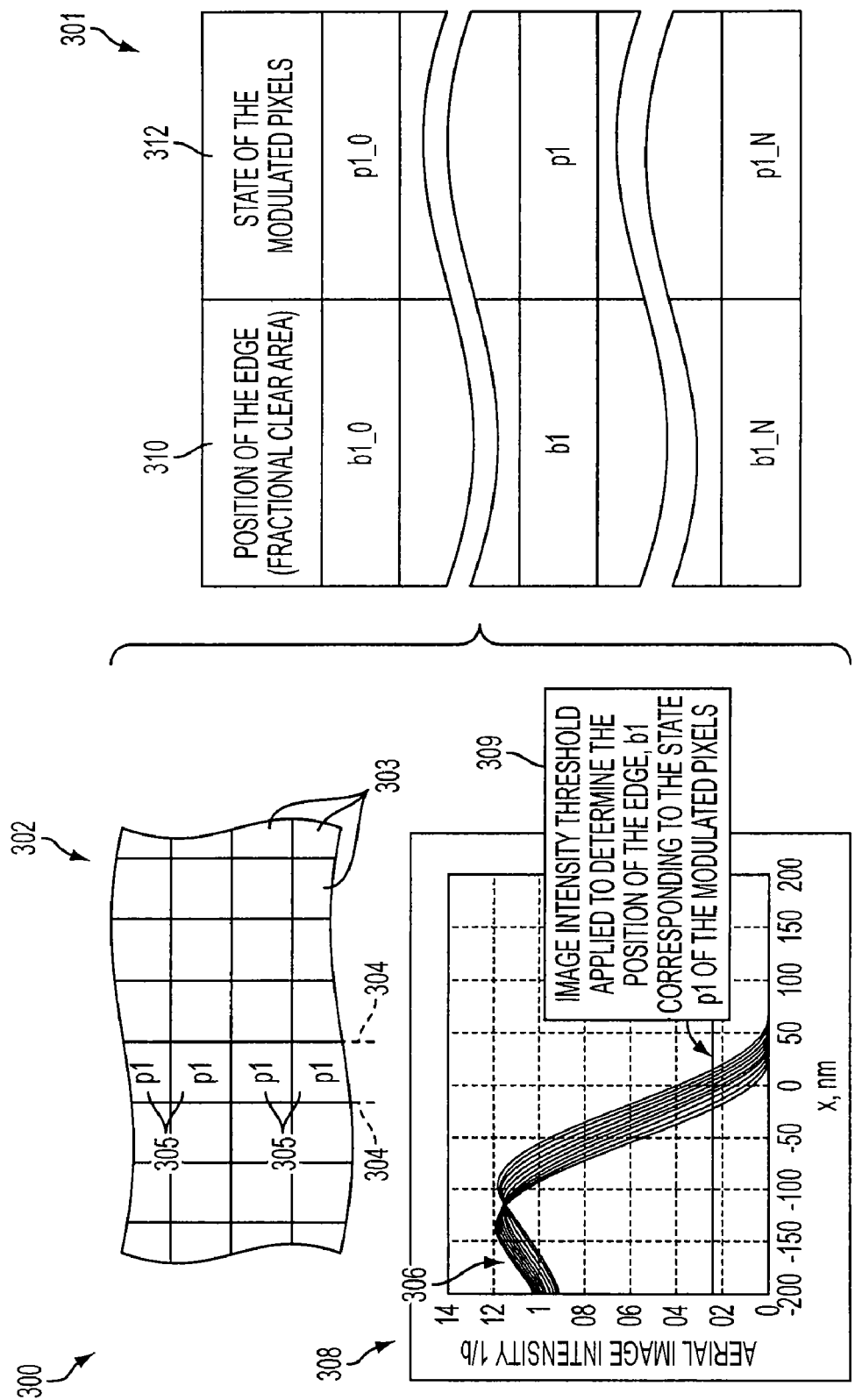
FIG. 3
CONVENTIONAL

METHOD AND SYSTEM FOR MASKLESS LITHOGRAPHY REAL-TIME PATTERN RASTERIZATION AND USING COMPUTATIONALLY COUPLED MIRRORS TO ACHIEVE OPTIMUM FEATURE REPRESENTATION

CROSS-REFERENCE TO RELATED APPLICATIONS

This application is a Divisional of U.S. Non-Provisional application Ser. No. 11/170,065, filed Jun. 30, 2005, now U.S. Pat. No. 7,209,275, issued Apr. 24, 2007, which is incorporated by reference herein in its entirety.

BACKGROUND OF THE INVENTION

1. Field of the Invention

The present invention relates to the field of maskless lithography. More particularly, the present invention relates to rasterization methods and modulation principles associated with pattern generation in a maskless lithography system.

2. Related Art

A significant challenge in maskless lithography is the development of efficient rasterization techniques to configure a reticle for projecting a desired pattern onto a substrate. For example, in the case of a spatial light modulator (SLM), the rasterization technique determines how to configure the SLM pixels in a manner that will result in projection of the desired pattern through the lithography system's projection optics.

One conventional rasterization technique used to configure SLM pixels includes describing the desired pattern as a union of polygons. For example, if the desired pattern is an integrated circuit (IC), the IC will be first described as the union of polygons that represent the elements of the transistors, logic devices, or other elements that combine to form the IC. These polygons include the lines, edges, and sequences of lines that form the smallest segments of the IC elements. This conventional rasterization technique is then used to select states of the SLM pixels to create images of these IC elements.

This conventional rasterization technique includes the computation of a parameter illumination table based on an isolated edge parallel to the pixel grid. This illumination table approach, however, has several limitations. First, it does not take into account the orientation of the edge. For example, edges associated with the desired pattern may have different slopes with respect to the pixel grid. Secondly, the conventional illumination table approach fails to take into account the interaction between edges of the pattern in the case when they are in close proximity to each other.

The limitations of the conventional illumination table approach, noted above, ultimately produce distortions in the aerial image. These distortions subsequently restrict the pattern resolution and the pattern placement accuracy that can be achieved by the lithography system.

Rasterization techniques are generally flexible enough to account for anomalies associated with different types of modulation. For example, rasterization values for configuring SLM pixels associated with tilting mirrors will differ from the values required to configure pistoning mirrors. This flexibility, however, is insufficient to compensate for more subtle anomalies. These more subtle anomalies can include imperfections in individual mirrors, such as curling and mirror height variations, and can lead to phase errors causing through-focus dose uniformity problems.

Tilt mirrors cannot inherently resolve these dose uniformity problems. For example, through-focus dose uniformity problems cannot be resolved by the absence of actuation of a piston degree of freedom (as is the case in pure tilt mirrors). Another challenge in relying on tilt mirrors, in these applications, is that tilt mirrors can only represent 0° or 180° phase intensity. For special situations (e.g., vortex contact hole printing), other phases (e.g. 90° or 270° or even intermediate values 45°, 135°, 315°) are needed.

Traditional pistoning mirrors alleviate some of the through-focus dose uniformity problems noted above. However, traditional pistoning mirror techniques can have parasitic tilt effects (that can be constant vs. phase or can vary with the phase actuation). Parasitic tilt leads to amplitude variations and finite values of the derivative of phase vs. the x or y coordinate, in turn causing not only through-focus dose variations, but also causing telecentricity errors.

What is needed, therefore, is a more efficient rasterization method and system for configuring SLM pixels to project desired patterns onto a substrate. What is also needed is a method and system to compensate for imperfections in individuals mirrors of the SLM.

BRIEF SUMMARY OF THE INVENTION

Consistent with the principles of the present invention as embodied and broadly described herein, the present invention includes a method for determining specific pixel modulation states of a spatial light modulator (SLM) to print a desired pattern on a substrate. The method includes selecting at least one super-pixel in an object plane of the desired pattern, the super-pixel being formed of at least two pixels. At least one edge of the desired pattern crosses a boundary within the super-pixel. The at least one edge is defined by specific slope and position parameters relative to the super-pixel. The method also includes (i) forming an interpolation table to tabulate pre-calculated pixel modulation states and (ii) determining the specific pixel modulation states for each of the pixels in accordance with the interpolation table.

In a second embodiment, the present invention includes a spatial light modulator (SLM). The SLM includes a plurality of mirrors structured to form groups of super-pixels. Each super-pixel (i) includes two or more mirrors from the plurality of mirrors and (ii) is configured to switch only one pixel of light. Each of the two or more mirrors can be separately actuated.

Further features and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated in and constitute part of the specification, illustrate embodiments of the invention and, together with the general description given above and detailed description given below, serve to explain the principles of the invention. In the drawings:

FIG. 3 is an illustration of a conventional illumination table rasterization technique;

DETAILED DESCRIPTION OF THE INVENTION

Figure 1:
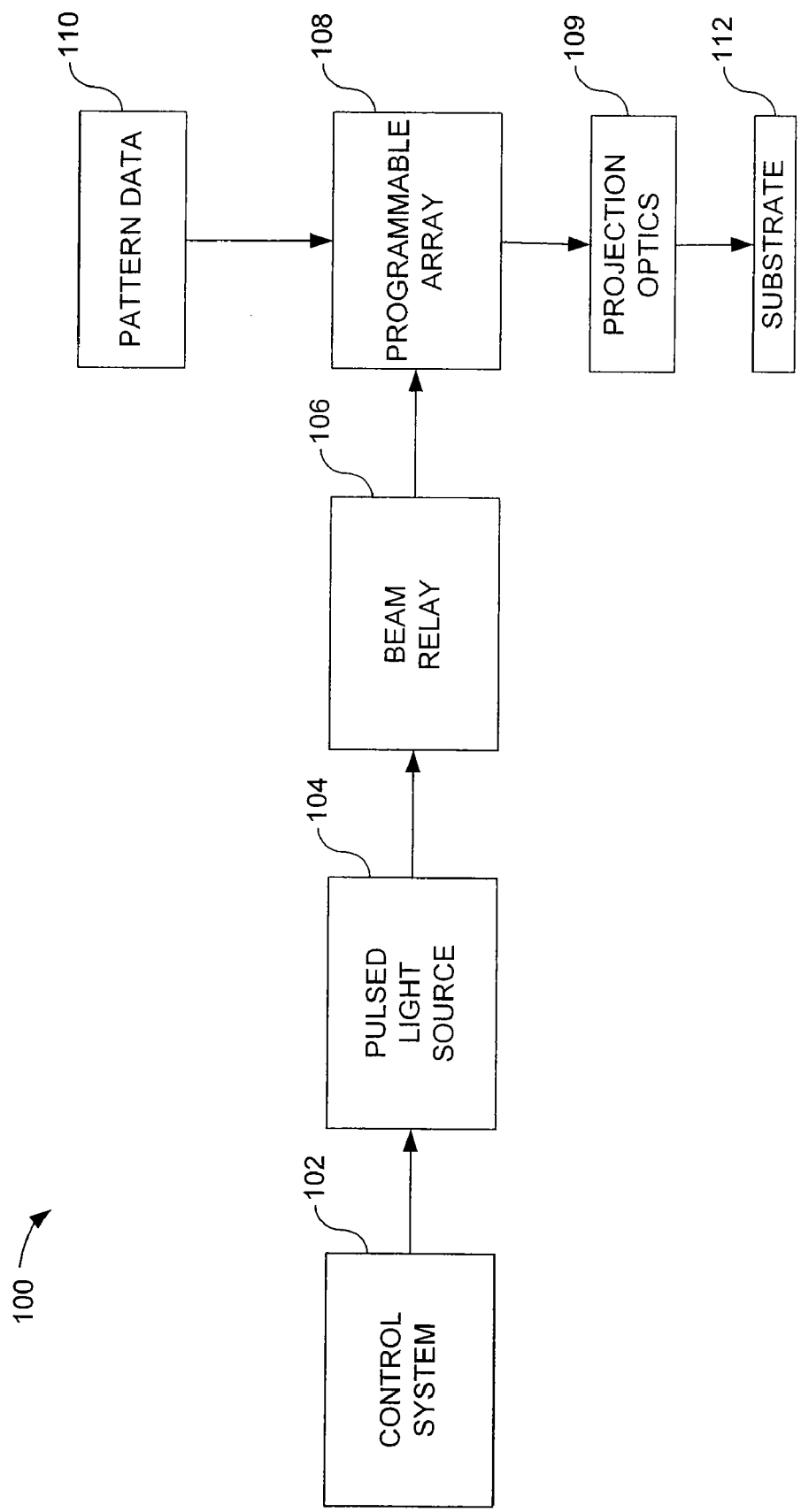
FIG. 1 is a block diagram illustration of a maskless lithography system structured in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized, controlled hardware to implement the present invention is not limiting of the present invention. Thus, the operation and behavior of the present invention will be described with the understanding that modifications and variations of the embodiments are possible, given the level of detail presented herein.

FIG. 1 is a block diagram view of a maskless lithography system arranged in accordance with an embodiment of the present invention. In FIG. 1, a maskless lithography system 100 includes a control system 102. The control system 102 includes a computer processor, a memory, and a user interface configured to enable a user to input data for instructing the maskless lithography system 100 to produce a printed pattern.

The control system 102 is coupled to a light source 104 which provides light (e.g., pulses) from a light source, such as an excimer laser or some other suitable illumination mechanism. The light source 104 is coupled to a beam relay system 106 which is typically an anomorphic system that includes a series of lenses to create a desired pupil filling and field uniformity in the light beam produced by the light source 104. The light output from the beam relay 106 is illuminated onto a programmable array 108.

The programmable array 108 is configured to receive image pattern data 110, representative of a desirable lithographic pattern, and reflect light representative of the image to a projection optics (PO) 109. The pattern data 110 is also known in the art as mask layout data (i.e., pre-rasterization). The light reflected from programmable array 108 passes through the PO 109 and then falls onto the substrate 112. The function of the Projection Optics is (1) to form an image of the object on the substrate and (2) to reduce the image compared to the dimensions of the object. A pattern, representative of the image data 110, is then imaged onto a photosensitive surface 112, such as a wafer substrate, which is being scanned at a constant velocity. As understood by those of skill in the art, the images that are to be projected onto the photosensitive surface 112 are contained in the programmable array 108 and may be changed by a user via the control system 102.

The programmable array 108 can include an SLM, or some other suitable micro-mirror array. By way of background, an SLM is an array composed of a multitude of individually controlled pixels (otherwise referred to as SLM elements). Each pixel can change its optical properties in a controllable manner so that the field in the object plane can be modulated. A typical SLM has square pixels arranged in a rectangular array, with each pixel having an ability to change only one of the parameters characterizing its optical properties (one-parametric local modulation) within a certain range.

For example, an existing SLM has 16×16 $\mu m^2$ tilting mirrors arranged in a 2040 ×512 array and running at a 1 KHz refresh rate. The light modulation principles implemented in different SLMs can be classified as transmittance modulation, modulation by light deflection, phase shift modulation, defocus modulation, and/or a combination of several of the aforementioned modulation types.

Figure 2:
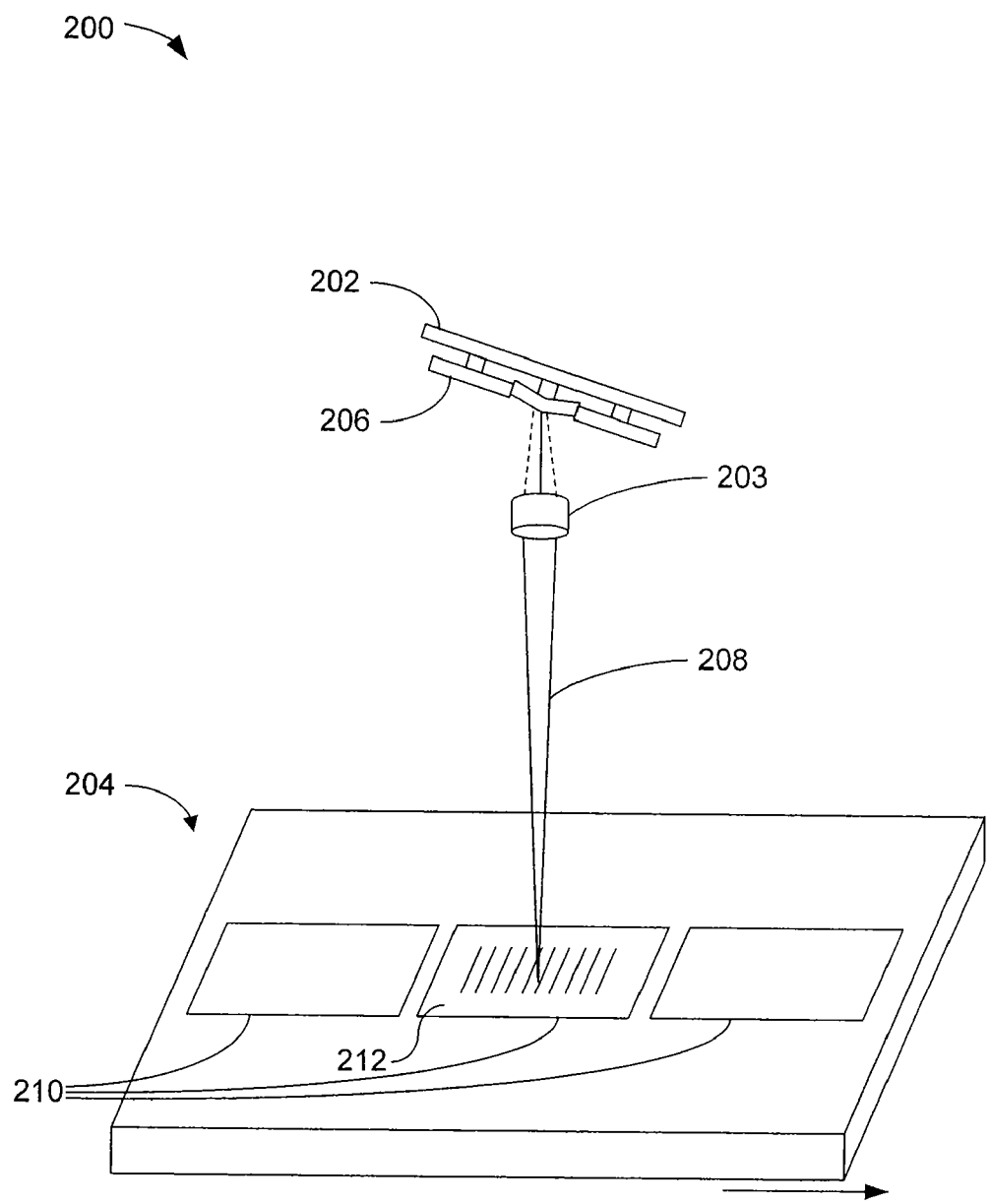
FIG. 2 is a diagrammatic perspective view of the exposure of a photosensitive surface consistent with principles of the present invention.

FIG. 2 is a diagrammatic perspective view of more detailed aspects a maskless lithography system, such as the system 100 of FIG. 1. In FIG. 2, a system 200 includes an SLM 202, a PO 203, and a substrate 204 having a photosensitive surface. The SLM 202 includes mirror elements 206 configured to reflect light pulses 208 onto the substrate 204 within two-dimensional exposure regions 210. The light pulses 208 are used to form a pattern 212 within the exposure regions 210.

By way of background, the printed pattern in a maskless lithography tool is formed from a sequence of two-dimensional exposures or shots. Each of these two-dimensional shots results from an image of a single SLM being projected to the surface of the wafer, and it results in deposition of a dose within a certain exposure zone. Additionally, each exposure is created by a single pulse of light from the pulsed light source. Since the two-dimensional exposure zones are stitched together edge-to-edge, the stitching is very critical. A displacement of one exposure zone on the order of a few nanometers can create pattern errors along the edge that are clearly visible and detrimental to features within the pattern.

FIG. 3 is a block diagram illustration of a conventional maskless rasterization technique 300. By way of background, the goal of rasterization is to determine, for a particular reticle pattern, how to configure individual SLM mirrors in order to form the optimum aerial image in a wafer plane.

The rasterization technique 300 includes a pre-calculated look-up (illumination) table 301 having values for configuring SLM pixels to project a desired pattern onto a substrate. An exemplary substrate is the substrate 204 of FIG. 2. The table 301 is derived by considering edges that are parallel to pixel edges.

For example, in FIG. 3, a pattern 302 is comprised of a plurality of pixels, such as pixels 303. The pattern 302 also includes a single isolated edge 304 represented by a column of pixels 305. The edge 304 can be created by turning pixels to left of the column 305 bright and turning pixels to right of the column 305 dark. To create a state other than bright or dark, however, the column of pixels 305 that form the edge 304 must be modulated. Thus, in FIG. 3, the pixels 305 are modulated in a manner to produce a pixel state P1.

The pixel state P1 must be selected in such a way so that the edge 304 (isolated), can be desirably positioned. This selection can be accomplished by simulating the aerial image. Calculation of the aerial image is represented by curves 306 in a graph 308. Each of the curves 306 represents the aerial image of the intensity of the edge 304 as a function of x. Each of the curves 306 also corresponds to a particular state of the edge pixels 305.

An image intensity threshold 309 is used to determine position of the edge 304. The image intensity threshold 309 is a function of inherent properties of the substrate 204, for example. The point at which the image intensity threshold 309 crosses the aerial image, represented by the curves 306, determines the position of the edge 304. Thus in the graph 308, the image intensity threshold 309 is selected in such a way that when the edge pixels 305 vary their state P1, the edge displaces by the distance equal to the dimension of the pixel in the image plane. Stated in other terms, the edge 304 can be moved from the left of the graph 308 to the right of the graph 308 by modulating the pixels 305 within certain limits.

The analysis represented by the graph 308 produces the illumination table 301, which aids in the rasterization of the corresponding mask representative of the pattern 302. The conventional illumination table 301 tabulates the dependence of a fractional clear area 310 (e.g., the position of the edge 304) based on the state of a pixel for a given illumination mode.

More specifically, to perform the rasterization of the binary mask, the conventional technique 300 determines, for each pixel within the pattern 302, the fractional clear area 310 of this pixel as a fraction of the pixel area covered by the bright portion of the pattern 302. The illumination table 301 is then used to look-up, or interpolate, a state 312 of the pixel that would result in the corresponding fractional clear area 310.

The illumination table 301, however, is based on an isolated edge parallel (single dimension) to the pixel grid. Thus, the illumination table 301 cannot account for the situation when the edge 304 is not parallel to the pixel grid. This "unparallel" scenario can be created by a slanted line or any other feature with a slanted edge, which will have critical dimension (CD) variation along it. Further, the conventional illumination table 301 does not account for the situation of several edges being in a close proximity to each other, as previously stated. The table 301 also fails to consider edges that may have different slopes with respect to the pixels that form the pattern 302. For example, the technique 300 cannot account for edges that might cross the pixels along the diagonal. If edges crossed the pixels along the diagonal, the conventional technique 300 would select the states 300 in the same was as if the edge was parallel.

Finally, conventional rasterization techniques, such as the technique 300, are generally required to operate in real-time. This real-time requirement limits applicability of aerial image optimization techniques to rasterization. The technique of the present invention, however, resolves these and many other deficiencies that are characteristic of the conventional rasterization techniques.

Figure 4:
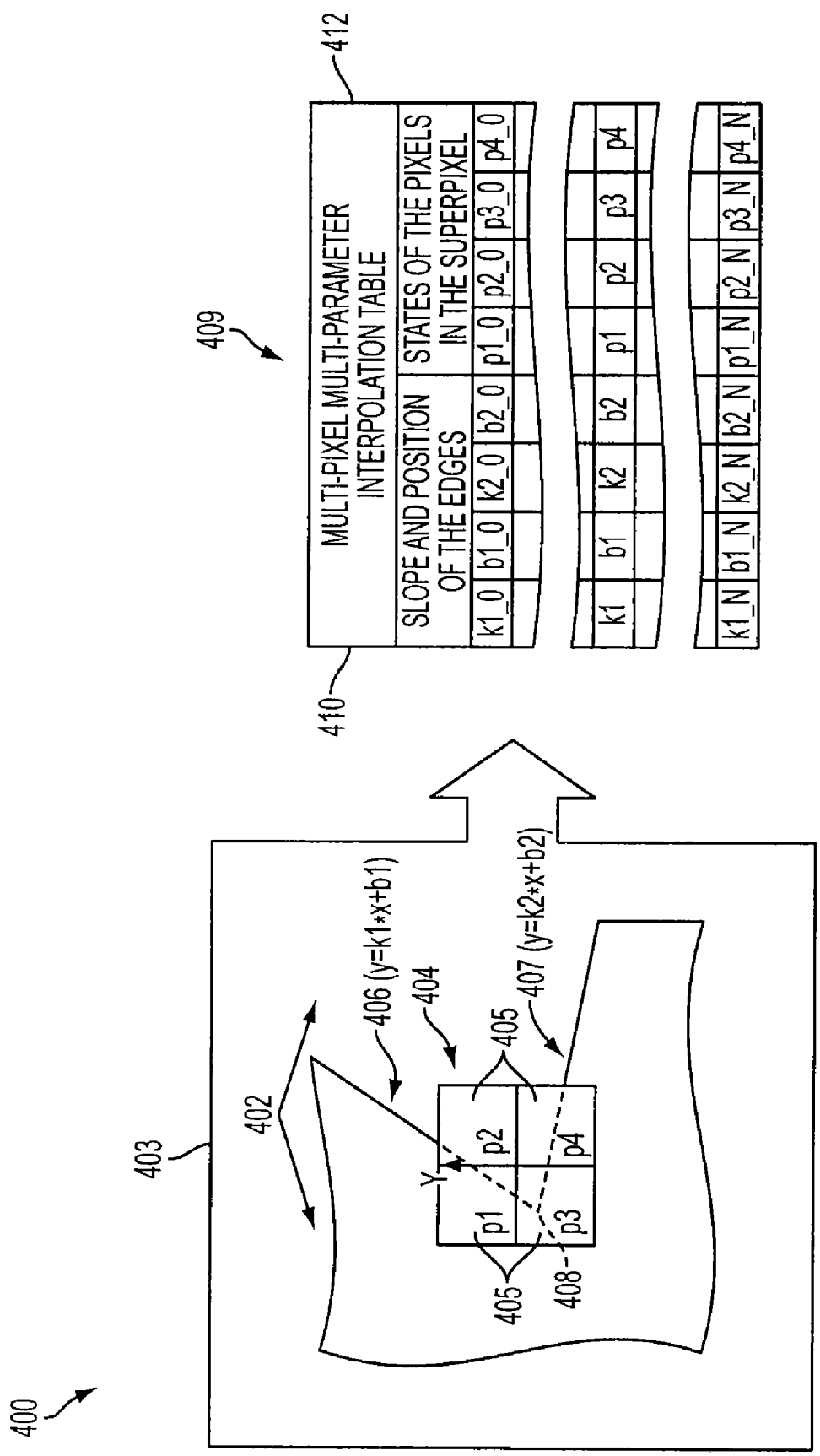
FIG. 4 is an illustration of a rasterization technique in accordance with an embodiment of the present invention.

FIG. 4 is an illustration of a rasterization technique 400 in accordance with an embodiment of the present invention. Instead of focusing on a single pixel at a time, the rasterization technique 400 considers several adjacent pixels, referred to herein (in the present embodiment) as super-pixels.

In the exemplary embodiment of FIG. 4, a super-pixel can be composed of four pixels that share a common corner. Instead of focusing on a single edge, the technique 400 of the present invention considers one or more edges, as described in greater detail below. More importantly, these edges can have arbitrary orientations, which results in a multi-dimensional approach to rasterization.

Additionally, in a first step, the rasterization technique 400 includes the off-line creation of a pre-calculated multi-pixel, multi-parameter interpolation table based upon predetermined illumination modes. In a second step, the technique 400 provides more accurate real-time rasterization, based upon the table pre-calculations. The combination of the pre-calculated multi-pixel, multi-parameter interpolation table and the more accurate real-time rasterization enable the present invention to account for edges that are non-parallel to the pixel grid. This approach also enables the present invention to account for the interaction between different edges.

The exemplary embodiment of the present invention shown in FIG. 4 considers patterns including one or more straight line edges crossing a super-pixel or passing in its proximity. For example, consider two edges that form a particular pattern. Each edge in the pattern can be characterized by two parameters (e.g. $y=k*x+b$, where k is the slope and b is the position in the frame or reference local to the super-pixel), with these parameters varying in certain steps within certain limits from one pattern to another. Only reasonable and meaningful pattern fragments should be considered.

Calculation of Multi-Parameter Interpolation Table

In FIG. 4, for example, a pattern 402 is formed within an object plane 403. A super-pixel 404 is formed of individual adjacent pixels 405. In accordance with principles of the present invention, super-pixels within an SLM can overlap, although overlap is not necessarily required. Further, super-pixels can be formed using different techniques. These differently formed super-pixels can then be combined, with the resulting combination being averaged to produce a final super-pixel.

As shown in FIG. 4, the pattern 403 includes edges 406 and 407. The edges 406 and 407 intersect to form a corner 408 within the super-pixel 404. The edge 406 can be defined by an exemplary expression $y=k1*x+b1$. The edge 407 can be defined by an exemplary expression $y=k2*x+b2$. The pattern 402, outside of the super-pixel 404, is a mask formed by the continuation of the straight line edges outside of the super-pixel 404 (thus, there are no pixels depicted outside of the super-pixel 404).

Inside the super-pixel 404, states p1, p2, p3, p4 (or tilts) of the individual pixels 405 are selected so that the pattern inside of the super-pixel 404 is rendered optimally for a given illumination mode (in the aerial image or even in the substrate). For instance, the states p1, p2, p3, p4 of the pixels 405 can be selected to minimize placement error (PE) of each of the edges forming the pattern within the super-pixel 404. The states p1, p2, p3, p4 can also be selected to ensure the highest possible normalized image log-slope (NILS) for each of the edges 406 and 407. Minimizing PE and ensuring the highest NILS would entail, for example, running the optimization routine (understood by those of skill in the art and described below) off-line.

Another method to select the states p1, p2, p3, p4 of the pixels 405 is to select them so that the diffracted field from the super-pixel 404 so that it optimally approximates the diffracted field from the mask pattern. This approximation needs to be performed over the portion of the pupil participating in the formation of the image for the given illumination mode.

Yet another method to select the states p1, p2, p3, p4 of pixels 405 avoids the optimization process by cycling through all possible pixel state combinations inside the super-pixel 404. After cycling through all possible combinations, only those states that correspond to a meaningful pattern fragment inside the super-pixel 404 are selected. The analysis to determine the specific states (p1, p2, p3, p4) of pixels 405 is then used to form a multi-dimensional, multi-parameter interpolation table 409.

The multi-dimensional, multi-parameter interpolation table 409 is pre-calculated and is independent of any specifically desired pattern. In other words, this pre-calculated multi-dimensional, multi-parameter interpolation table 409 represents an initial step that is performed off-line.

Being independent of any specifically desired pattern, the multi-dimensional, multi-parameter interpolation table 409 is dependent upon the geometry of the pixels of the SLM. The interpolation table 409 is also dependent upon the modulation principle used, the illumination mode, the wavelength of light, and parameters of projection optics of the lithography system. After calculation of the multi-dimensional, multi-parameter interpolation table 409 has been completed, the table values are then stored in system memory for later use by during the rasterization process.

Individuals segments of the pattern 402 (described above) will form line entries in the interpolation table 409. Aspects of the segments (e.g., k1_0, b1_0, k2_0, b2_0) will form entries of a table column 410, that represents slope and position of the edges 406 and 407. Other aspects of the segments (e.g., p1_0, p2_0, p3_0, p4_0) will form entries of a table column 412, that represents states of pixels 405. That is, the specific states p1, p2, p3, p4 of the pixels 405, within the super-pixel 404, will result in a pattern fragment that is formed by two edges 406 and 407.

In the specific case of the two edges 406 and 407, the edge parameters will be (k1 b1) and (k2 b2), respectively, provided that the pattern 402 is extended beyond the super-pixel 404. Note that these parameters are reflected as a line entry in the multi-pixel, multi-parameter interpolation table 409. This procedure is then repeated and generalized to all super-pixels defined within the SLM. Additionally, the procedure will include all possible fragments for all potential patterns.

By way of review, the multi-dimensional, multi-parameter interpolation table 409 is constructed by examining all of the possible meaningful combinations (polygons, rectangular features, intersecting lines, etc.) of slopes and positions of generic patterns that might be of potential interest. This process is performed apriorily and is performed off-line. To build each line in the interpolation table 409, one should desirably specify values of slopes/positions of at least two edges.

Next, one should select a suitable optimization technique. Optimization techniques are well known to those of skill in the art and are used to select the state of pixels that will result in the pattern lines that intersect to form angles, or other features, that might occur within a super-pixel of the SLM. The universe of these possible combinations results in formation of the multi-dimensional, multi-parameter interpolation table 409.

An alternative method to provide the multi-dimensional, multi-parameter interpolation table 409 can be to examine the pixels that form each of the super-pixels within the SLM. Each of these pixels can then be driven through all possible states to compute the slope and position of edges that could potentially be formed.

Real-Time Rasterization

Although the multi-dimensional, multi-parameter interpolation table 409 is pre-calculated off-line, rasterization of desired images can be performed on-line and in real-time.

The real-time rasterization approach of the present invention, described more fully below, determines the states of particular pixels required to project a desired pattern on a substrate. These states are determined by conceptually overlaying the desired pattern onto the super-pixels of an SLM. The multi-dimensional, multi-parameter interpolation table 409 was pre-calculated based upon these generic pattern related to the super-pixels. The values within the interpolation table 409 correspond to and represent pixel state (rasterization) settings necessary to produce the generic patterns (polygons, rectangular features, intersecting lines, etc.) discussed above.

The first step in the real-time rasterization process includes overlaying the desired pattern with the pre-calculated super-pixels. When the desired pattern is over-laid with the pre-calculated super-pixels, features of the desired pattern will match (within predetermined thresholds) features of the generic patterns whose pixels state values have been apriorily recorded in the interpolation table 409. These pre-calculated pixel state values (related to generic patterns) can be used to compute rasterization values for the desired pattern. These values can be derived from the pre-calculated table 409 entries through direct look-up, or they can be interpolated from these table entries.

Stated another way, once values within the multi-dimensional, multi-parameter table 409 have been computed, one can examine the table values and do the look-up, or use table values to perform interpolation, and then compute the precise rasterization. Standard optimization techniques (well known to those of skill in the art) are then used to determine, through use of user defined thresholds, what values from the table can be used, and how close matches between desired pattern values and generic pattern values, must be.

The desired pattern (to be printed) can be split into fragments corresponding to each of the super-pixels, such as the super-pixel 404. The SLM pixels are also divided into super-pixels (e.g., including four pixels that share a common corner). This step produces the grid of super-pixels. Next, a suitable exposure strategy should be used. Many different strategies, all well known to those in the art, are available The exposure strategy determines, for example, that when a particular laser pulse is received at the SLM, the wafer is moved such that this pulse will be properly projected onto the SLM to form the desired pattern.

Once the grid of super-pixels is determined, the desired pattern can be divided into pieces that may be overlapping to ensure stitching. The desired pattern is first divided into pieces that correspond to each SLM. Each super-pixel covers a portion of the pattern. Generally this portion of the pattern will include line edges or corners of the pattern. This portion may also include portions of the background and portions of the features of the polygon. Theoretically, a super-pixel can include many corners and edges. For most cases, however, there will be either no edges, one edge, or at most two edges that intersect at a certain angle, to form the corner.

By way of example, when the super-pixel is composed of four pixels sharing a common corner, the geometry of the segment of the pattern that overlaps the super-pixel is desirably known. When this geometry is known, the states of the four pixels that form the super-pixel can be computed. The state of the pixel, however, is dependent on the modulation principle used in the SLM. For example, using tilting mirrors, the state could represent the degree of tilt. If pistoning mirrors are used, the state could represent the level of voltage to drive the pistons.

In the example of FIG. 4, where the edges 406 and 407 intersect to form the angle 408 within the super-pixel 404, the two edges 406 and 407 are characterized by four parameters. The four parameters, for example, include the slope of the edge 406, position of the edge 406, slope of the edge 407, and position of the edge 407 (indicated in the formula above), to form a parameter quadruple. This quadruple characterizes the exact geometry of a fraction of the desired pattern. At this point, the multi-dimensional, multi-parameter interpolation table 409 can be used. The interpolation table 409 includes the values of the slopes and positions of two (generic) edges that correspond to the fraction of the desired pattern.

Generally, the interpolation table 409 will not include entries representative that precisely match characteristics of the desired pattern. The interpolation table 409 can be used, however, (i) as a look-up table that picks the closest quadruple or (ii) to provided pixel state values from which an interpolation can be performed.

Within, and in the vicinity of each super-pixel, the pattern fragment is analyzed and reduced to a small number (e.g. two) of edges that form the pattern fragment. These edges have the parameters (k1 b1) and (k2 b2). The quadruple (k1, b1, k2, b2) is used to interpolate in the pre-computed multi-dimensional, multi-parameter table 409 for the interpolated values of the pixels (p1, p2, p3, p4). This procedure is then repeated for all super-pixels within the SLM Many different conventional techniques, all well known to those of skill in the art, can be used to account for the fact that the some edges might have an opaque semi-plane on one side and a transparent semi-plane on the other. For example, this scenario exists when two edges intersecting at the same angle may form different pattern fragments depending on the edge orientation.

The present invention provides infinite slope for any edges parallel to the y axis. for example, instead of the single slope k, unit normalized components can be used to parametrize the slope of the edge: x*cos (alpha)+y*sin (alpha)=b. The unit normal components are [cos (alpha) sin (alpha)] and one convention mentioned above can be that the normal always points towards the bright semi-plane forming the edge.

Pattern fragments can be formed by at least one edge located entirely outside of super-pixels, such as the super-pixel 404. Such edges still influence the pattern inside the super-pixel. Additionally, edges may or may not intersect within the super-pixel. Although the current embodiment of the present invention uses the example of super-pixels that have four pixels, the number of pixels in the super-pixel could be more than four or less than four. Also, the number of edges forming the fragment of the pattern could be more than two or less than two.

Figure 5:
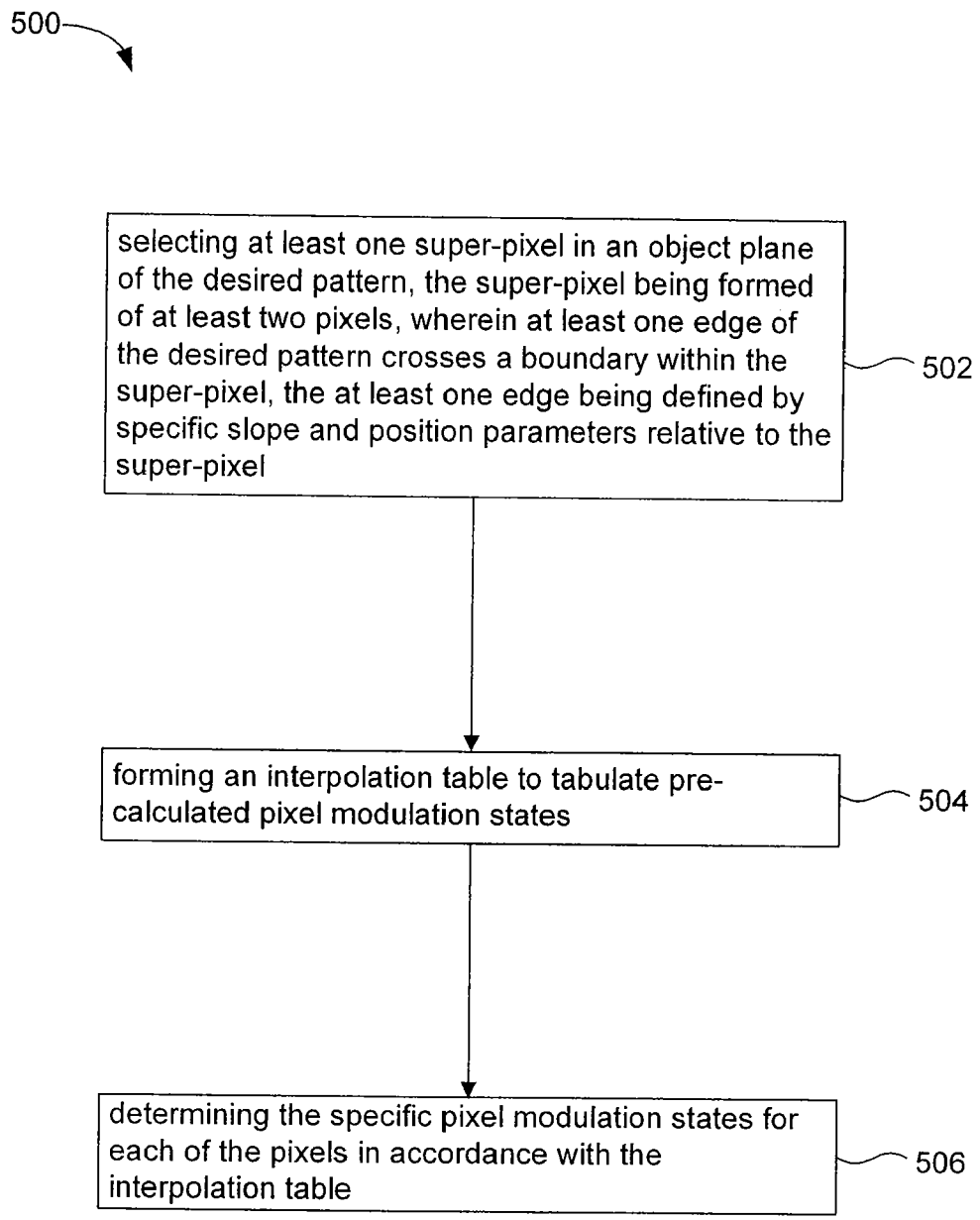
FIG. 5 is a flow diagram of an exemplary method of practicing the technique illustrated in FIG. 4.

FIG. 5 is a flow diagram of an exemplary method 500 of practicing the technique 400 of FIG. 4. In the method 500, at least one pixel is selected in an object plane of a desired pattern, the super-pixel being formed of at least two pixels, wherein at least one edge of the desired pattern crosses a boundary within the super-pixel, as indicated in step 503. The at least one edge is defined by specific slope and position parameters relative to the super-pixel. In step 504, an interpolation table is formed to tabulate pre-calculated pixel modulation states. Specific pixel modulation states are then determined for each of the pixels in accordance with the interpolation table, as indicated in step 506.

Computationally Coupled Mirrors

As noted above, rasterization techniques can compensate for some anomalies associated with different modulation techniques. However, rasterization alone cannot compensate for more subtle anomalies, such as mirror imperfections (height variations, etc.), which can lead to dose uniformity problems. A second embodiment of the present invention provides a method and system for reducing the affects of mirror imperfections.

Figure 6A:
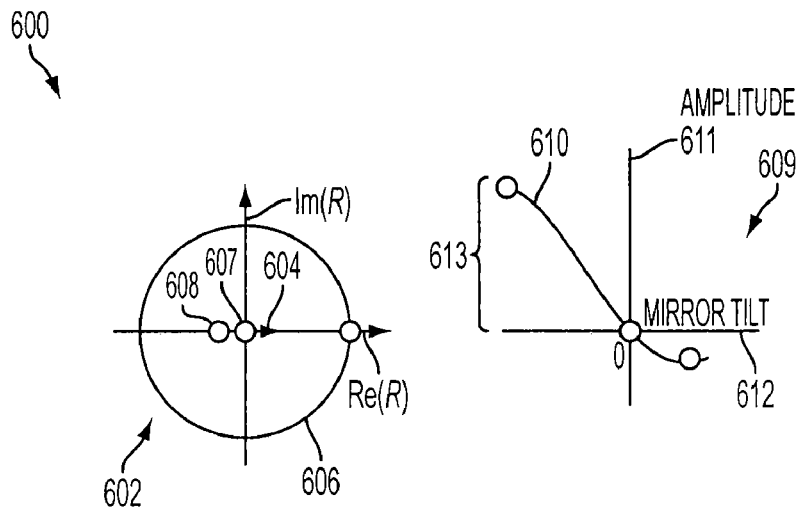
FIG. 6A is a graphical illustration of amplitude and phase characteristics associated with conventional tilt mirrors.

Conventional optical mask lithography systems can use, for example, tilt mirrors, phase step tilt mirrors, piston mirrors, or hybrid piston-tilt mirrors. FIG. 6A is a graph 600 of amplitude and phase characteristics of conventional tilt mirrors.

As a preliminary matter, square tilt mirrors generally achieve a modulation between 100% and 0% positive phase intensity and beyond to 4.5% negative phase intensity. It is desirable to obtain negative-phase intensity of 100% to be able to emulate alternating phase shift masks. Square phase step tilt mirrors reach intensity modulation between 50%, 0% and beyond to −50%. These mirrors reach symmetric intensity modulation in positive and negative phase, however at the expense of 50% intensity loss. Manufacturing of exact ¼λ phase steps anywhere over the device is complex (see FIG. 7, for example, where mirror portions 710 and 712 combine to form a phase step mirror).

FIG. 6A provides a model 602 to show the electromagnetic field (e-field) resulting from a single tilt mirror with respect to its environment. More specifically, the model 602 depicts a plot of the effective reflectivity of the modulated pixel mirrors. As understood by those of skill in the art, effective reflectivity is the field generated by the modulated pixel mirror at the origin of the pupil space, divided by some reference value of the field (e.g. the field at the origin of the pupil space generated by the un-modulated mirror pixel). Assuming the light is reflected from a single mirror, the light can be represented by an e-field vector. Depending on the type of mirror, the e-field is modified by the mirror in a specific manner.

In FIG. 6A, as the mirror is tilted, the e-field is modulated. In the case of a tilt mirror, it is not the phase of the reflected light that is affected as the e-field is modulated (tilted), but the amplitude of the light. The model 602 includes an e-field magnitude vector 604. The length of the magnitude vector 604 becomes smaller as the mirror is tilted. The e-field vector 604 is formed at the edge of a unit circle 606 (representing interaction of real and imaginary e-field components).

As shown in FIG. 6A, the e-field vector 604 is directed towards a center 607 of the unit circle 606, along the x-axis. The magnitude of the e-field is represented by the length of the vector 604. If the degree of tilt of the mirror continues to increase, the actual e-field magnitude becomes slightly negative 608 (i.e., negative black).

Generally, in the case of perfect tilt mirrors, the magnitude vector will be reduced along the x-axis from +1 to zero. In the case of non-perfect tilt mirrors, the curve will slightly deviate with the major thing being that it does not cross the zero point. Around zero, there will be an imaginary e-field component so that in addition to the reduction in magnitude, there will also be some refocusing due to combination of images resulting from the real and imaginary components. The bottom line with tilt mirrors, however, is that the e-field amplitude is directly a function of the degree of mirror tilt.

A graph 609 is provided to illustrate that the tilt mirror has a relatively large amplitude curve 610, measured along the y axis 612. This amplitude curve depicts a maximum amplitude 613. As the mirror is actuated, however, the graph 609 illustrates that the amplitude curve 610 decreases and the reflected light changes phase as the curve 610 crosses the y-axis 611. The amplitude becomes slightly negative as the curve 610 crosses the x-axis 612.

Figure 6B:
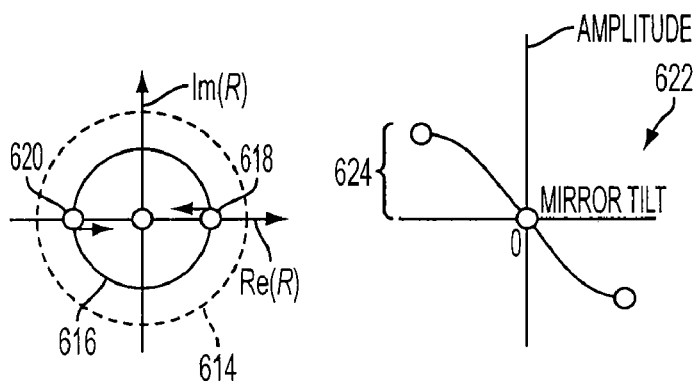
FIG. 6B is a graphical illustration of amplitude and phase characteristics associated with conventional phase step mirrors.

FIG. 6B is a graphical illustration of amplitude and phase characteristics of conventional phase step mirrors. In FIG. 6B, a dotted circle 614 is provided as a point of comparison between the maximum achievable amplitude of a phase step mirror when compared to maximum amplitude 613, achievable in the tilt mirror of FIG. 6A. A smaller concentric circle

614 is provided to show the boundary of the achievable maximum amplitude of light reflected by the conventional phase-step mirror.

In FIG. 6B, light amplitude vectors 618 and 620 show that when the mirror is in a rest situation (i.e., not actuated), the amplitude of the reflected wave is zero. That is, in this rest situation, the light is dark. As the mirror is tilted, the light amplitude becomes positive or negative, depending on the tilt direction. If tilted in one direction, the amplitude vector 618 achieves maximum length (i.e., maximum amplitude) as it travels toward the concentric circle 614 along the x axis, in a first direction. As the mirror is tilted in the other direction, the amplitude vector 620 achieves maximum length as it travels toward the concentric circle 614 along the x axis, in a second direction.

One shortcoming of the phase-step mirror is that at maximum intensity, the amplitude of the reflected light is still less than unity, when compared to a regular mirror, such as a tilted mirror model of FIG. 6A. This principle is illustrated more clearly in a graph 622, which depicts that the maximum achievable amplitude 624 of phase-step mirrors is still less than the maximum achievable amplitude 613 of tilt mirrors.

As understood by those of skill in the art, the left side of a phase-step mirror is in opposite phase from its right side. Therefore, there is always a degree of cancellation between the left side of the phase-step mirror and its right side. This cancellation results in its decreased amplitude, since each side is in opposite phase with the other. With the phase step mirror, and depending on the direction of actuation, one will have pulled light in-phase or out of phase. Additionally, with the phase step mirror, although the maximum obtainable amplitude is less than the amplitude of a regular tilt mirror, the amount of negative e-field is the same as the amount of positive e-field.

Figure 6C:
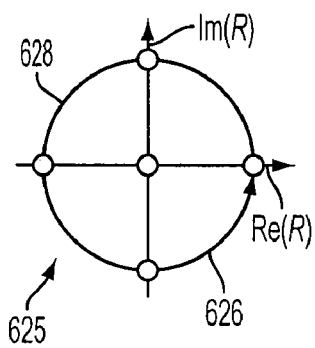
FIG. 6C is a graphical illustration of amplitude and phase characteristics associated with conventional piston mirrors.

FIG. 6C is a graphical illustration 625 of amplitude and phase characteristics of conventional piston mirrors. More particularly, FIG. 6C indicates that if the phase of the light is modified in a fully uniform manner (e.g., by pistoning), then the phase of the e-field is affected.

FIG. 6C also depicts rotation of an e-field magnitude vector 628 along a unit circle 628. As one can observe from the graph 625, pistoning does not affect the amplitude of the vector. Pistoning does, however, affect the phase (i.e., angle) of the vector. Thus, by pistoning the mirror, the phase of the reflected light can be changed without affecting its amplitude.

Piston mirrors have a pure phase modulation effect (amplitude modulation of piston mirrors stems from the cooperative effect of multiple piston mirrors having different phase heights). The average phase over larger pixel areas is ideally constant over areas of multiple pixels to guarantee telecentricity of the imaging. The derivative of phase vs. the spatial x, y coordinates in the plane of the array of piston mirrors is ideally also 0 to ensure dose uniformity in the image through-focus.

Typically piston mirrors are square and densely packed in an array. Also triangular or hexagonal mirrors can used to densely pack the area. For appropriate imaging the pixel size on wafer level is typically ½ the critical dimension of the features to be printed (e.g. 30 nm pixels for 60 nm lines and spaces). Piston mirrors are typically actuated to positive phase and negative phase alternately in x and y direction resulting in a checker-board pattern of + and − phase.

Piston mirrors have inherent phase and amplitude advantages over other types of mirrors, such as tilt mirrors. For example, tilt mirrors can only represent 0° or 180° phase intensity. For special applications, such as vortex contact hole printing, other phases (e.g., 90° or 270° or even intermediate values 45°, 135°, 315°) are needed. These other phases can be achieved with piston mirrors. However, piston mirrors can have parasitic tilt effects (can be constant v. phase or vary with the phase actuation). Parasitic tilt leads to amplitude variations and finite values of the derivative of phase vs. the x or y coordinate, in turn causing the through focus dose variations and telecentricity errors noted above. The present invention provides a technique that reduces these dose variations and telecentricity errors.

The present invention provides an assembly of n×m (n=2, 4, . . . , n even) piston sub-pixels as a single super-pixel that, by proper actuation of the sub-pixels, acts as a pure gray-level modulator. Parasitic errors of the sub-pixels are compensated on the super-pixel level by collective actuation of the sub-pixels taking advantage of the n×n degrees of freedom.

The pure gray-level modulator concept of the present invention offers the additional advantage that errors (e.g. parasitic tilt errors or reflectivity errors) on the sub-pixel level, can be compensated on the super-pixel level. Each of the super-pixels now having n×n (4, 9, 16, . . . for n=2, 3, 4 . . . ) degrees of freedom to compensate for these errors.

Figure 7:
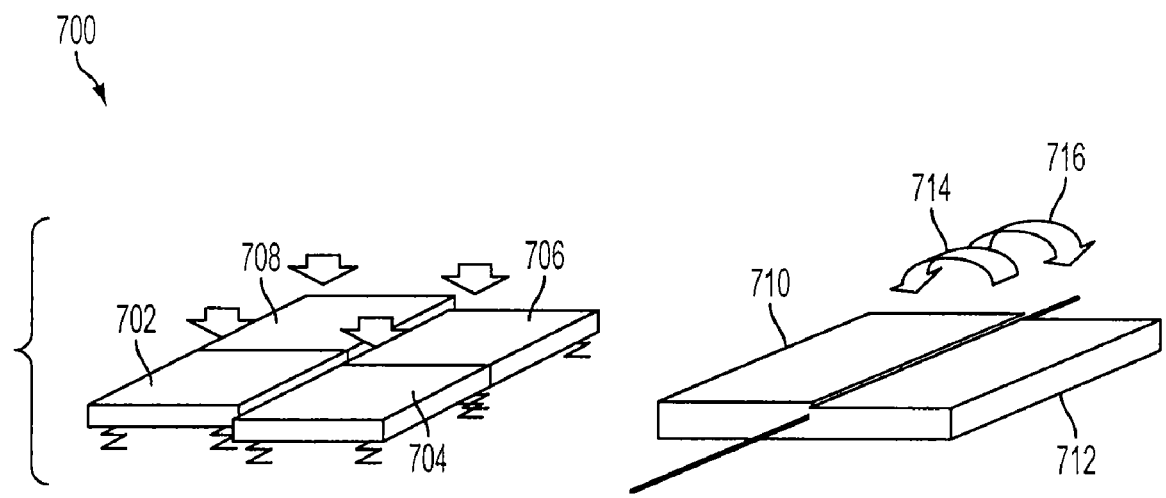
FIG. 7 is an illustration of a super-pixel in accordance with a second embodiment of the present invention.

Among other things, FIG. 6C provides an illustration of phase and amplitude characteristics of a single piston mirror. FIG. 7, however, provides a mirror configuration 700 representing four mirrors 702, 704, 706, 708 configured to emulate (offering phase and amplitude advantages) the effects of the single mirror of FIG. 6C.

Although FIG. 7 depicts the use of four mirrors (behaving as one mirror), the present invention is not limited to four mirrors and can use any suitable number of individually addressable mirrors. Similarly, although the exemplary n×m assembly above indicated that "n" was an even number, "n" can also be an odd number. Each of the individually addressable mirrors can also include a separate actuation means.

Stating that the mirror configuration 700 behaves as a single mirror means that the mirrors (sub-pixels) 702, 704, 706, and 708 can be independently pistoned (moved up and down) in a manner to compensate for imperfections contained in a single mirror. Additionally, since the configuration 700 includes four mirrors, the e-field amplitude components of each of the four mirrors 702, 704, 706, and 708 provide a combined amplitude at a level of four times the level of the single mirror of FIG. 6C.

In terms of addressing, the super-pixel 700 is addressed as one pixel in the optimization routine (mentioned above). In order to calculate an aerial image or a resist image, the super-pixel 700 is used as a single pixel. The result of this approach is an enhanced an e-field that behaves like the e-field of a single mirror. With multiple mirrors (sub-pixels), one can synthesize the e-field representative of a single mirror by using the combination 700 of mirrors 702, 704, 706, and 708.

Although individual mirrors will have imperfections, specifics of these imperfections can be quantified during the standard pre-calibration process. With knowledge of these imperfections one can still achieve the requested e-field both in phase and in amplitude because the combination 700 of mirrors 702, 704, 706, and 708. The e-field can be achieved because the mirrors 702, 704, 706, and 708 can be actuated in multiple degrees of freedom.

For example, two pistoning mirrors, such as mirrors 710 and 712, will produce two independent e-fields. As shown in FIG. 7, one vector 714 rotates along one unit circle and another vector 716 rotates along another unit circle, similar to the illustration of FIG. 6C. The linear combination of the two vectors 714 and 716 will produce the required e-field. In principle, all e-fields inside the unit circle are possible with a combination of the two vectors 714 and 716.

In other applications, a regular mirror could be combined with a phase-step mirror and/or a pistoning mirror to form the super-pixel. Where the regular mirror can be used to control the amplitude of the e-field and the phase-step mirror and/or the pistoning mirror, to control the angle of the e-field. If both of the mirrors 710 and 712 are calibrated correctly, each mirror can be used to compensate the imperfections of the other.

As an example, during execution of the optimization routine, one can determine what the optimal e-field distribution should be across the super-pixel. During this step, the individual mirror defects need not be taken into account. During execution of the optimization routine, e-fields are requested of the different super-pixels. Because knowledge of the individual mirror imperfections was previously obtained during calibration, as noted above, during a final step the e-field can be translated into deflection values of for the individual mirrors 702, 704, 706, and 708. This process compensates for the defects of the individual mirrors and/or non-functional mirrors.

Defects can also be compensated for by performing specific mechanical and optical measurements related to the individual mirrors. For example, the surface of an individual mirror can be measured to determine any anomalies in its actuation levels. Also, the image intensity of individual mirrors can be measured based upon specific test patterns. The results of these measurements can then be used to reconfigure other mirrors within the super-pixel.

In terms of addressing, each of the different sub-pixels or individual mirrors 702, 704, 706, and 708 has its own address line. And as a final mater, mirror calibration can be performed and the resulting calibration data can be stored locally, on the chip.

Figure 8:
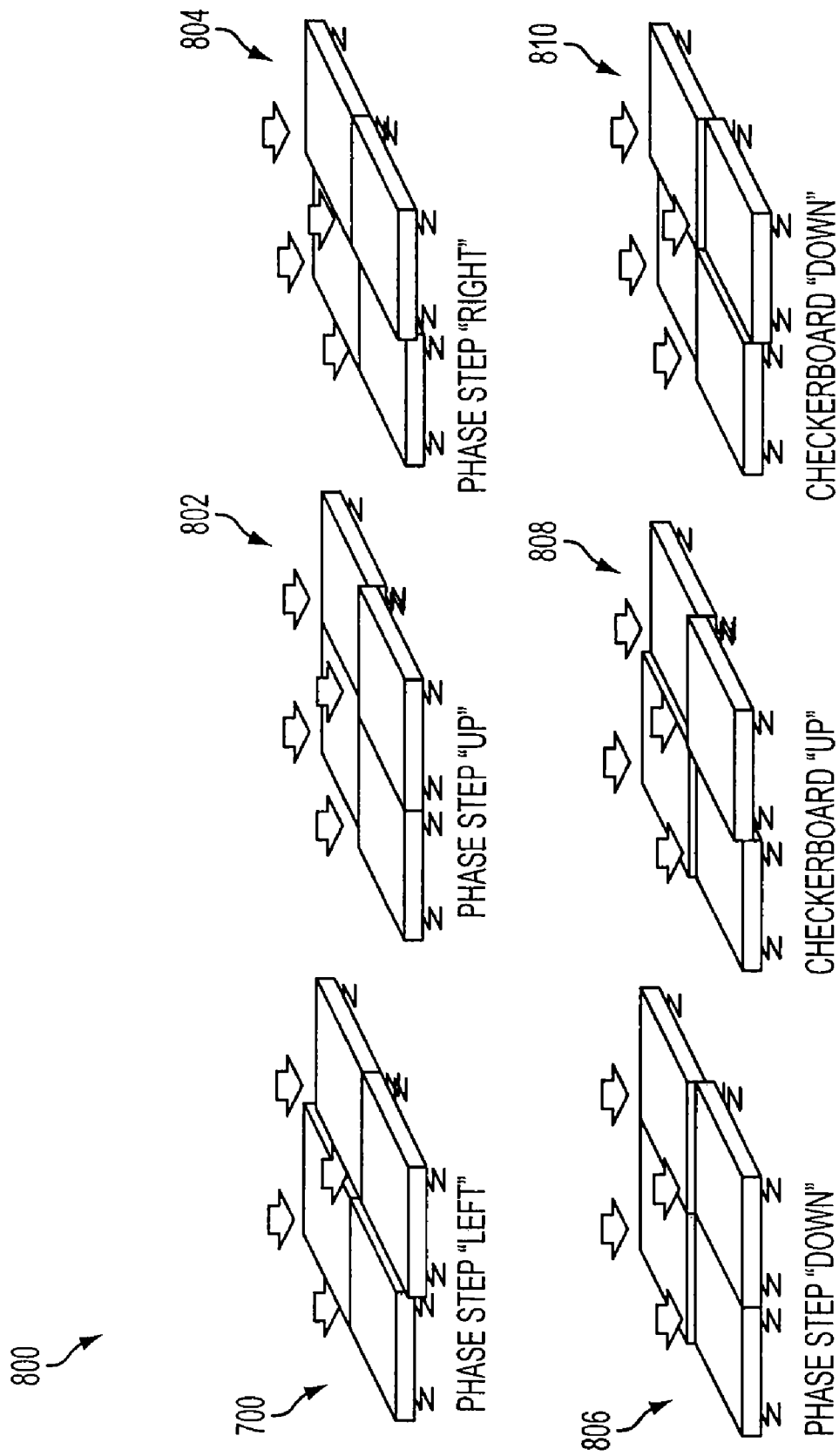
FIG. 8 is an illustration of variations of the embodiment of the present invention illustrated in FIG. 7.

FIG. 8 provides a number of different exemplary pistoning variations 800 of the embodiment of the present invention of FIG. 7. In FIG. 8, the combination 700 (phase step left) is shown along with a phase step up configuration 802, and a phase step right approach 804. Also included is an exemplary phase step down approach 806, a checkerboard up approach 808, and a checkerboard down 810. Each of the different variations 800 offers unique advantages, each of which capitalizes on the n×m degrees of freedom of the super-pixel. Other approaches can include, for example, combinations of phase-step (tilt) and piston mirrors within one super-pixel.

In the mirror combinations of FIGS. 7-8, a pure gray-level modulation mode is provided (to emulate binary, attenuated phase shift or alternating phase-shift or chromeless phase lithography masks). Actuation of the sub-pixels 702, 704, 706, and 708 is such that for the entire pixel:

The intensity is anywhere between 100, 0% and −100%;

The average phase of the pixel is either exactly 0° or 180°; and

The derivative of phase vs. x and y is zero.

Figure 9:
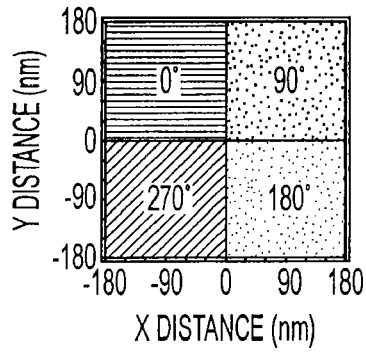
FIG. 9 is a graphical illustration of vortex production features of the embodiment of the present invention illustrated in FIGS. 7 and 8.
Figure 9:
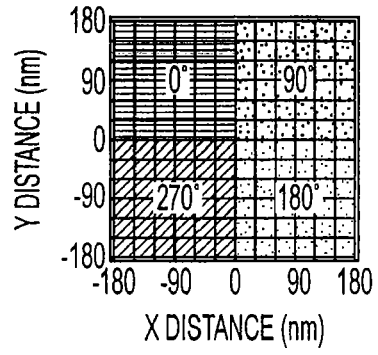
Figure 9:
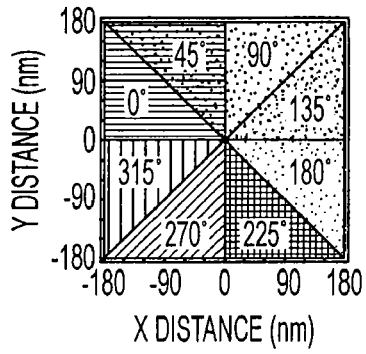
Figure 9:
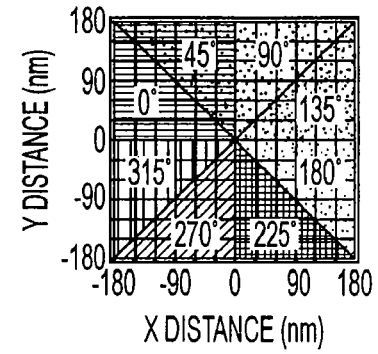

FIG. 9 provides graphical illustrations 900 showing that the embodiment of the present invention of FIGS. 6-8 can be used to produce vortex imaging. Vortex imaging is exotic and difficult to realize. Typically multiple etch steps are required to realize the vortex. Pistoning mirror devices provide more flexibility in order to mimic the ideal vortex situation. One can use the present invention to construct a vortex mask or image.

Alternatively, in pure phase-modulation mode ( e.g. to mimic vortex mask contact printing (needing phases anywhere between 0° and 360°) the piston mirrors can be used to collectively define areas of defined phase anywhere between 0° and 360°.

Figure 10:
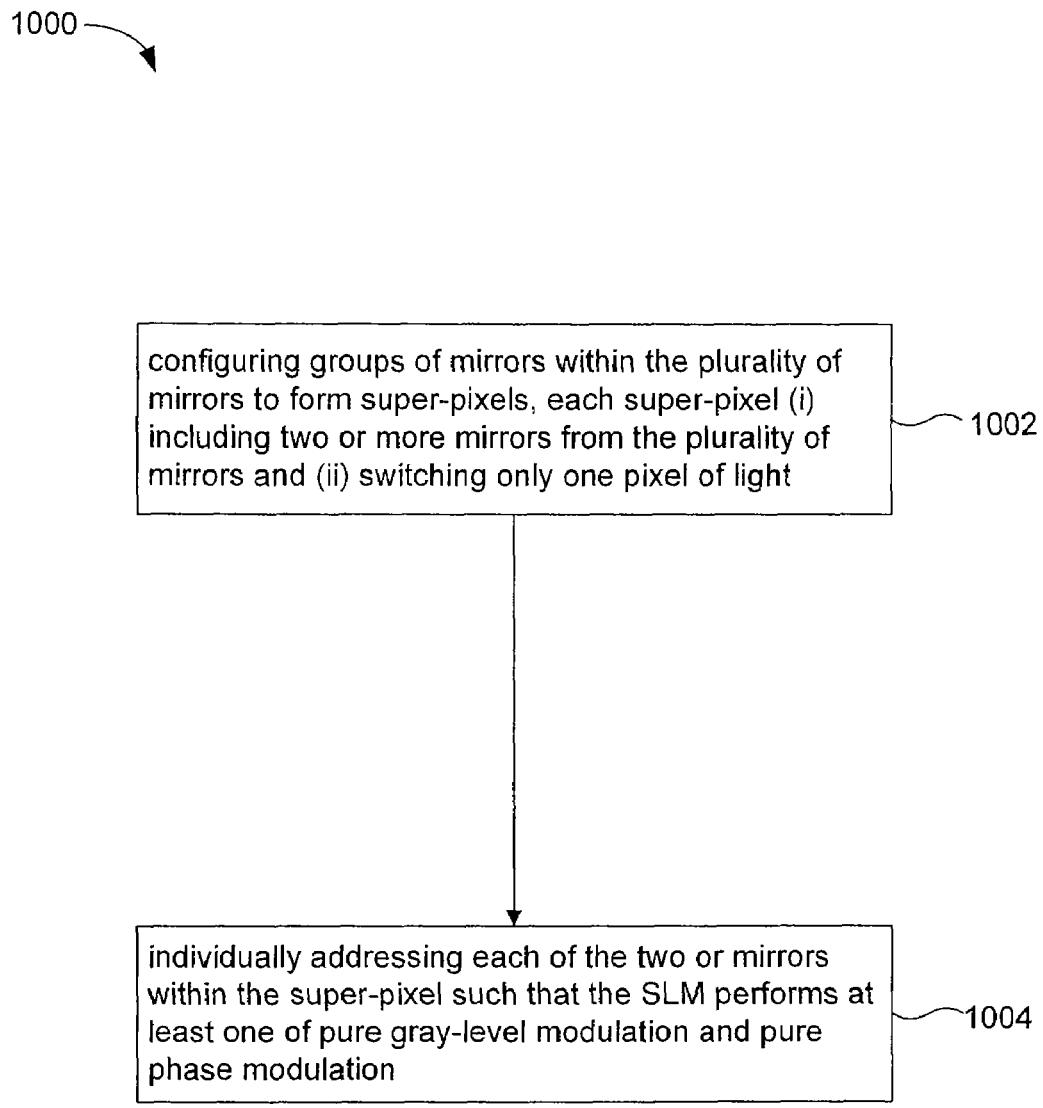
FIG. 10 is a flow diagram of an exemplary method of practicing the techniques illustrated in FIGS. 7 and 8.

FIG. 10 is a flow diagram of an exemplary method 1000 of practicing the embodiment of the present invention illustrated in FIGS. 6-8. In the method 1000, groups of mirrors are configured within the plurality of mirrors to form super-pixels, each super-pixel (i) including two or more mirrors from the plurality of mirrors and (ii) switching only one pixel of light, as indicated in step 1002. In step 1004, each of the two or mirrors within the super-pixel is individually addressed such that the SLM performs at least one of pure gray-level modulation and pure phase modulation.

Figure 11:
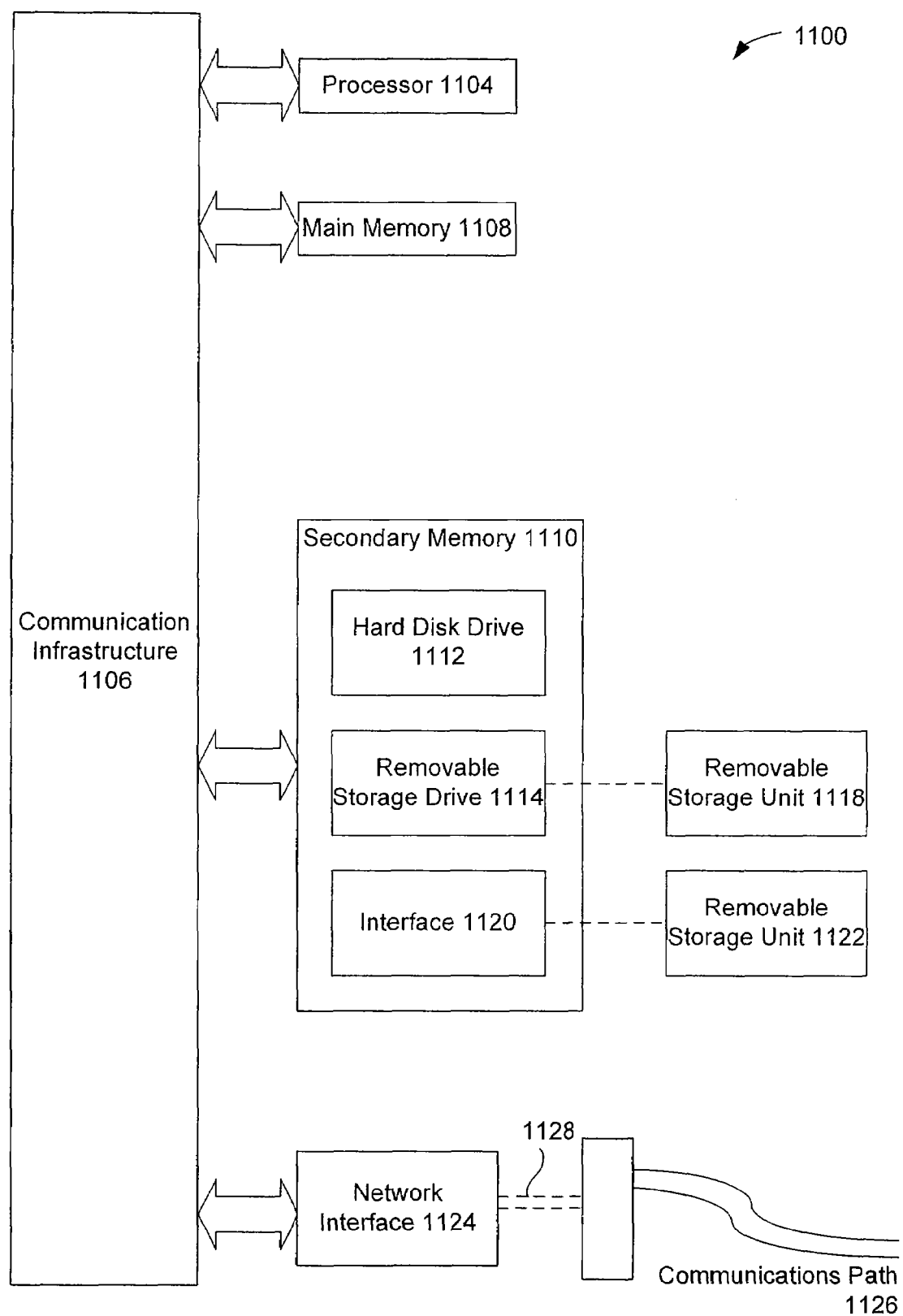
FIG. 11 is a block diagram of an exemplary computer system on which the present invention can be practiced.

As stated above, the present invention can be implemented in hardware, or as a combination of software and hardware. Consequently, the invention may be implemented in the environment of a computer system or other processing system. An example of such a computer system 1100 is shown in FIG. 11.

The computer system 1100 includes one or more processors, such as a processor 1104. The processor 1104 can be a special purpose or a general purpose digital signal processor. The processor 1104 is connected to a communication infrastructure 1106 (for example, a bus or network). Various software implementations are described in terms of this exemplary computer system. After reading this description, it will become apparent to a person skilled in the relevant art how to implement the invention using other computer systems and/or computer architectures.

The computer system 1100 also includes a main memory 1108, preferably random access memory (RAM), and may also include a secondary memory 1110. The secondary memory 1110 may include, for example, a hard disk drive 1112 and/or a removable storage drive 1114, representing a floppy disk drive, a magnetic tape drive, an optical disk drive, etc. The removable storage drive 1114 reads from and/or writes to a removable storage unit 1118 in a well known manner. The removable storage unit 1118, represents a floppy disk, magnetic tape, optical disk, etc. which is read by and written to by removable storage drive 1114. As will be appreciated, the removable storage unit 1118 includes a computer usable storage medium having stored therein computer software and/or data.

In alternative implementations, the secondary memory 1110 may include other similar means for allowing computer programs or other instructions to be loaded into the computer system 1100. Such means may include, for example, a removable storage unit 1122 and an interface 1120. Examples of such means may include a program cartridge and cartridge interface (such as that found in video game devices), a removable memory chip (such as an EPROM, or PROM) and associated socket, and the other removable storage units 1122 and the interfaces 1120 which allow software and data to be transferred from the removable storage unit 1122 to the computer system 1100.

The computer system 1100 may also include a communications interface 1124. The communications interface 1124 allows software and data to be transferred between the computer system 1100 and external devices. Examples of the communications interface 1124 may include a modem, a network interface (such as an Ethernet card), a communications port, a PCMCIA slot and card, etc. Software and data transferred via the communications interface 1124 are in the form of signals 1128 which may be electronic, electromagnetic, optical or other signals capable of being received by the communications interface 1124. These signals 1128 are provided to the communications interface 1124 via a communications path 1126. The communications path 1126 carries the signals 1128 and may be implemented using wire or cable, fiber optics, a phone line, a cellular phone link, an RF link and other communications channels.

In the present application, the terms "computer readable medium" and "computer usable medium" are used to generally refer to media such as the removable storage drive 1114, a hard disk installed in the hard disk drive 1112, and the signals 1128. These computer program products are means for providing software to the computer system 1100.

Computer programs (also called computer control logic) are stored in the main memory 1108 and/or the secondary memory 1110. Computer programs may also be received via the communications interface 1124. Such computer programs, when executed, enable the computer system 1100 to implement the present invention as discussed herein.

In particular, the computer programs, when executed, enable the processor 1104 to implement the processes of the present invention. Accordingly, such computer programs represent controllers of the computer system 1100. By way of example, in the embodiments of the invention, the processes/methods performed by signal processing blocks of encoders and/or decoders can be performed by computer control logic. Where the invention is implemented using software, the software may be stored in a computer program product and loaded into the computer system 1100 using the removable storage drive 1114, the hard drive 1112 or the communications interface 1124.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention.

Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination of one of ordinary skill in the art.

What we claim is:

1. A spatial light modulator (SLM), comprising:
   a plurality of mirrors structured to form groups of super-pixels, each super-pixel including two or more mirrors from the plurality of mirrors;
   wherein, for a given super-pixel, individual mirrors of the two or more mirrors of that given super-pixel are configured to be separately actuated to compensate for an imperfection of at least one of the two or more mirrors of that given super-pixel.

2. The spatial light modulator of claim 1, wherein the plurality of mirrors is configured to perform pure gray modulation.

3. The spatial light modulator of claim 1, wherein the plurality of mirrors are pistoning mirrors.

4. The spatial light modulator of claim 1, wherein the two or more mirrors within each super-pixel cooperate to behave as a single tilting mirror.

5. The spatial light modulator of claim 1, wherein the two or more mirrors includes at least four mirrors.

6. The spatial light modulator of claim 1, wherein the two or more mirrors form an array.

7. The spatial light modulator of claim 6, wherein each mirror within the array represents a degree of manipulation freedom.

8. The spatial light modulator of claim 1, wherein the actuation of each mirror is caused by a separate piston.

9. The spatial light modulator of claim 1, wherein each of the two or more mirrors can be individually addressed.

10. A method for modulating light within a spatial light modulator (SLM) including a plurality of mirrors, the method comprising:
    configuring groups of mirrors within the plurality of mirrors to form super-pixels, each super-pixel including two or more mirrors from the plurality of mirrors;
    individually addressing each of the two or more mirrors within the super-pixel such that the SLM performs at least one of pure gray-level modulation and pure phase modulation; and
    re-configuring particular mirrors within at least one group of the groups of mirrors to compensate for defects in at least one other mirror within the at least one group.

11. The method of claim 10 wherein the re-configuring is based upon at least one of a measured actuation level and an image intensity associated with the particular mirrors.

12. An apparatus for modulating light within a spatial light modulator (SLM) including a plurality of mirrors, the apparatus comprising:
    means for configuring groups of mirrors within the plurality of mirrors to form super-pixels, each super-pixel including two or more mirrors from the plurality of mirrors; and
    means for individually addressing each of the two or more mirrors within the super-pixel such that the SLM performs at least one of pure gray-level modulation and pure phase modulation;
    wherein, for a given super-pixel, individual mirrors of the two or more mirrors of that given super-pixel are configured to be separately actuated to compensate for an imperfection of at least one of the two or more mirrors of that given super-pixel.

13. An apparatus for modulating light within a spatial light modulator (SLM) including a plurality of mirrors, the apparatus comprising:
    means for configuring groups of mirrors within the plurality of mirrors to form super-pixels, each super-pixel including two or more mirrors from the plurality of mirrors; and
    means for individually addressing each of the two or more mirrors within the super-pixel such that the SLM performs at least one of pure gray-level modulation and pure phase modulation;

wherein imperfections of individual mirrors of the two or more mirrors are compensated for by separately actuating the two or more mirrors to cause the two or more mirrors to act as a single pixel.

14. A method for modulating light within a spatial light modulator (SLM) including a plurality of mirrors, the method comprising:
   configuring groups of mirrors within the plurality of mirrors to form super-pixels, each super-pixel including two or more mirrors from the plurality of mirrors;
   individually addressing each of the two or more mirrors within the super-pixel such that the SLM performs at least one of pure gray-level modulation and pure phase modulation; and
   compensating for parasitic tilt errors of an assembly of n×m pixels of light from the super-pixel by collectively actuating n×m mirrors of the super-pixel using n×n degrees of freedom.

15. A method for modulating light within a spatial light modulator (SLM) including a plurality of mirrors, the method comprising:
   configuring groups of mirrors within the plurality of mirrors to form super-pixels, each super-pixel including two or more mirrors from the plurality of mirrors;
   individually addressing each of the two or more mirrors within the super-pixel such that the SLM performs at least one of pure gray-level modulation and pure phase modulation; and
   computationally coupling individual mirrors of the SLM for rasterizing the plurality of mirrors of the SLM by configuring the SLM in super-pixels to project a desired maskless lithography real-time pattern onto a substrate with an optimum feature representation.

* * * * *

UNITED STATES PATENT AND TRADEMARK OFFICE
CERTIFICATE OF CORRECTION

PATENT NO.        : 7,773,287 B2                                    Page 1 of 1
APPLICATION NO.   : 11/790222
DATED             : August 10, 2010
INVENTOR(S)       : Latypov et al.

It is certified that error appears in the above-identified patent and that said Letters Patent is hereby corrected as shown below:

Column 16, lines 57-67 and Column 17, lines 1-4, delete printed claim 13 and insert correct claim 13 as follows:

-- 13. A method for modulating light within a spatial light modulator (SLM) including a plurality of mirrors, the method comprising:

configuring groups of mirrors within the plurality of mirrors to form super-pixels, each super-pixel including two or more mirrors from the plurality of mirrors;

individually addressing each of the two or more mirrors within the super-pixel such that the SLM performs at least one of pure gray-level modulation and pure phase modulation; and compensating for reflectivity errors of an assembly of n x m pixels of light from the super-pixel by collectively actuating n x m mirrors of the super-pixel using n x n degrees of freedom. --

Signed and Sealed this

Nineteenth Day of October, 2010

David J. Kappos
*Director of the United States Patent and Trademark Office*